(12) United States Patent
Wells et al.

(10) Patent No.: US 8,664,742 B2
(45) Date of Patent: Mar. 4, 2014

(54) SEMICONDUCTOR SUBSTRATES WITH UNDERCUT STRUCTURES

(75) Inventors: David H. Wells, Boise, ID (US); H. Montgomery Manning, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 179 days.

(21) Appl. No.: 12/622,939

(22) Filed: Nov. 20, 2009

(65) Prior Publication Data

US 2010/0065941 A1 Mar. 18, 2010

Related U.S. Application Data

(62) Division of application No. 11/445,911, filed on Jun. 2, 2006, now Pat. No. 7,625,776.

(51) Int. Cl.
*H01L 21/70* (2006.01)

(52) U.S. Cl.
USPC ....... 257/510; 257/509; 257/506; 257/E29.02

(58) Field of Classification Search
USPC ......... 257/316, 322, 397, 513, 315, 510, 509, 257/648, 506, E29.02
See application file for complete search history.

(56) References Cited

U.S. PATENT DOCUMENTS

| | | | |
|---|---|---|---|
| 4,407,058 A | 10/1983 | Fatula, Jr. et al. | |
| 4,531,282 A | 7/1985 | Sakai et al. | |
| 4,891,255 A | 1/1990 | Ciarlo | |
| 5,177,576 A | 1/1993 | Kimura et al. | |
| 5,427,975 A | 6/1995 | Sparks et al. | |
| 5,498,891 A * | 3/1996 | Sato | 257/316 |
| 5,536,675 A | 7/1996 | Bohr | |
| 6,100,162 A | 8/2000 | Doan et al. | |
| 6,245,615 B1 | 6/2001 | Noble et al. | |
| 6,290,863 B1 | 9/2001 | Morgan et al. | |
| 6,319,333 B1 | 11/2001 | Noble | |
| 6,339,241 B1 | 1/2002 | Mandelman et al. | |
| 6,358,861 B1 | 3/2002 | Ohji et al. | |
| 6,391,793 B2 | 5/2002 | Lee et al. | |
| 6,465,865 B1 | 10/2002 | Gonzalez | |
| 6,518,112 B2 | 2/2003 | Armacost et al. | |
| 6,551,875 B2 | 4/2003 | Tsao | |
| 6,566,273 B2 | 5/2003 | Kudelka | |
| 6,602,745 B2 | 8/2003 | Thwaite et al. | |
| 6,660,180 B2 | 12/2003 | Lee et al. | |
| 6,686,214 B2 | 2/2004 | Antaki et al. | |

(Continued)

FOREIGN PATENT DOCUMENTS

WO WO0075984 12/2000

OTHER PUBLICATIONS

Bassous, Ernest, "Fabrication of Novel Three-Dimensional Microstructures by the Anisoptropic Etching of (100) and (110) Silicon," IEEE Transactions on Electron Devices, Oct. 1978, pp. 1178-1185, vol. 25, No. 10.

(Continued)

*Primary Examiner* — Bilkis Jahan
(74) *Attorney, Agent, or Firm* — TraskBritt

(57) ABSTRACT

An intermediate semiconductor structure that comprises a substrate and at least one undercut structure formed in the substrate is disclosed. The undercut feature may include a vertical opening having a lateral cavity therein, the vertical opening extending below the lateral cavity. The lateral cavity may include faceted sidewalls.

21 Claims, 5 Drawing Sheets

(56) References Cited

U.S. PATENT DOCUMENTS

| | | | |
|---|---|---|---|
| 6,713,341 B2 | 3/2004 | Chen et al. | |
| 6,784,076 B2 | 8/2004 | Gonzalez et al. | |
| 6,808,994 B1 | 10/2004 | Wang | |
| 6,825,127 B2 | 11/2004 | Ouellet et al. | |
| 6,841,825 B2 * | 1/2005 | Kurosaki et al. | 257/330 |
| 6,858,903 B2 | 2/2005 | Natzle et al. | |
| 6,881,622 B2 | 4/2005 | Yu et al. | |
| 6,902,962 B2 | 6/2005 | Yeo et al. | |
| 6,909,147 B2 | 6/2005 | Aller et al. | |
| 6,927,104 B2 | 8/2005 | Lee et al. | |
| 6,960,507 B2 | 11/2005 | Kim et al. | |
| 6,960,821 B2 | 11/2005 | Noble et al. | |
| 6,963,114 B2 | 11/2005 | Lin | |
| 6,964,903 B2 | 11/2005 | Forbes et al. | |
| 6,968,110 B2 | 11/2005 | Patel et al. | |
| 6,969,648 B2 | 11/2005 | Cheng et al. | |
| 6,977,227 B2 | 12/2005 | Lin et al. | |
| 7,045,073 B2 | 5/2006 | Hareland et al. | |
| 7,045,407 B2 | 5/2006 | Keating et al. | |
| 7,045,468 B2 | 5/2006 | Liang | |
| 7,126,187 B2 | 10/2006 | Aoki et al. | |
| 7,166,539 B2 | 1/2007 | Fucsko et al. | |
| 7,628,932 B2 | 12/2009 | Lee et al. | |
| 2001/0000918 A1 | 5/2001 | Forbes et al. | |
| 2001/0025985 A1 | 10/2001 | Noble | |
| 2002/0025636 A1 | 2/2002 | Ju | |
| 2002/0140019 A1 * | 10/2002 | Nakahata et al. | 257/306 |
| 2003/0057438 A1 | 3/2003 | Yu et al. | |
| 2004/0014280 A1 | 1/2004 | Willer et al. | |
| 2004/0067346 A1 | 4/2004 | Hofmann et al. | |
| 2004/0214436 A1 | 10/2004 | Dow | |
| 2006/0003525 A1 | 1/2006 | Noble et al. | |
| 2006/0046428 A1 * | 3/2006 | Baiocco et al. | 438/425 |
| 2007/0173007 A1 | 7/2007 | Lee et al. | |
| 2007/0281493 A1 | 12/2007 | Fucsko et al. | |
| 2010/0291385 A1 | 11/2010 | Greer et al. | |

OTHER PUBLICATIONS

Bean, Kenneth E., "Anisotropic Etching of Silicon," IEEE Transactions on Electron Devices, Oct. 1978, pp. 1185-1193, vol. 25, No. 10.

Chen, Applied Physics 298r on Mask Orientation, Apr. 12, 2004.

Chu et al., AA Novel Convex Corner Compensation for Wet Anisotropic Etching on (100) Silicon Wafer,@ Date Unknown, pp. 253-256.

Fried et al., AImproved Independent Gate N-Type FinFET Fabrication and Characterization,@ IEEE Electron Device Letters, Sep. 2003, pp. 592-594, vol. 24, No. 9.

Huang et al., ASub-50nm P-Channel FinFET,@ IEEE Transactions on Electron Devices, May 2001, pp. 880-886, vol. 48, No. 5.

Jackson et al., "An Electrochemical P-N Junction Etch-Stop for the Formation of Silicon Microstructures," IEEE Electron Device Letters, Feb. 1981, vol. EDL-2, No. 2.

Kim et al., "Advance Integration Technology for a Highly Scalable SOI DRAM with SOC (Silicon-On-Capacitors)," IEDM, 1996, pp. 605-608, vol. 96.

Lee et al., ANovel Body Tied FinFET Cell Array Transistor DRAM with Negative Word Line Operation for sub 60nm Technology and Beyond,@ 2004 Symposium on VLSI Technology Digest of Technical Papers, pp. 130-131.

Lee et al., "A Novel Pattern Transfer Process for Bonded SOI Gigabit DRAMS," Proceedings 1996 IEEE International SOI Conference, Oct 1996, pp. 114-115.

Lee et al., AThe Surface/Bulk Micromachining (SBM) Process: A New Method for Fabricating Released MEMS in Single Crystal Silicon,@ Dec. 1999, vol. 8, No. 4.

Pandhumsoporn et al., AHigh Etch Rate, Deep Anistropic Plasma Etching of Silicon for MEMS Fabrication,@ Date Unknown, pp. 1-9.

Wagner, Andrew, Akoh Si Wet Etch Review,@ Date Unknown, pp. 1-14.

Yeo, et al., "80 nm 512M DRAM with Enhanced Data Retention Time Using Partially-Insulated Cell Array Transistor (PiCAT)," 2004 Symposium on VLSI Technology Digest of Technical Papers, pp. 30-31.

International Search Report dated Nov. 26, 2007, for International Application No. PCT/US2007/012904 (3 pages).

Sato et al., Development of an Orientation-Dependent Anisotropic Etching Simulation System MICROCAD, Electronics and Communications in Japan, Part 2, vol. 83, No. 4, 2000, pp. 13-22.

Yeo et al., Transistor test structures for leakage current analysis of partial SOI,: Date Unknown, 2 pages.

Merriam-Webster Dictionary, Definition of UNDERCUT, obtained online Sep. 8, 2011, 2 pages, online web address http://www.merriam-webster.com/dictionary/undercut.

Undercut, Definition at Dictionary.com, http://dictionary.reference.com/browse/undercut, obtained Jan. 22, 2012, 3 pages.

* cited by examiner

SEMICONDUCTOR SUBSTRATES WITH UNDERCUT STRUCTURES

CROSS-REFERENCE TO RELATED APPLICATIONS

The present application is a divisional of application Ser. No. 11/445,911, filed Jun. 2, 2006, now U.S. Pat. No. 7,625,776, issued Dec. 1, 2009, which is related to U.S. patent application Ser. No. 11/445,718, filed Jun. 2, 2006, now U.S. Pat. No. 7,628,932, issued Dec. 8, 2009, and U.S. patent application Ser. No. 11/445,544, also filed Jun. 2, 2006, now U.S. Pat. No. 7,709,341, issued May 4, 2010, each assigned to the Assignee of the present application, the disclosure of each of which application is incorporated by reference herein in its entirety.

FIELD OF THE INVENTION

The present invention relates to intermediate semiconductor structures and methods of fabricating intermediate semiconductor structures. More specifically, the present invention relates to a method of forming a partially isolated active area on a semiconductor substrate by selectively removing doped regions of the semiconductor substrate relative to undoped regions, and intermediate semiconductor structures formed from the same.

BACKGROUND OF THE INVENTION

In the fabrication of semiconductor devices, there is relentless pressure to miniaturize components to achieve higher circuit density on a single semiconductor chip and to increase semiconductor device speed and reliability, lower energy usage, and provide better portability of the semiconductor devices. In this way, electronic equipment becomes smaller and more reliable, assembly and packaging costs are minimized, and integrated circuit ("IC") performance is improved. However, as components become smaller and are packed closer together, leakage and second order effects of the semiconductor device become significant.

One semiconductor device that is subject to the pressure to miniaturize is the dynamic random access memory ("DRAM"). DRAMs include arrays of memory cells, each of which includes a field effect access transistor and a capacitor. Typically, a first side of the field effect access transistor is connected to a first side of the capacitor. A second side of the field effect access transistor and a transistor gate electrode are connected to connection lines of the array called a bit line and a word line, respectively. The second side of the capacitor is connected to a reference voltage. Therefore, forming the DRAM memory cell includes forming the field effect access transistor, the capacitor, and contacts to external circuits. The DRAM memory cell conventionally includes one metal oxide semiconductor ("MOS") transistor and one capacitor within a semiconductor substrate on which a plurality of spaced gates (word lines) and a plurality of spaced metal traces (bit lines) are aligned perpendicular to each other in widthwise and lengthwise directions. Additionally, one active area having two gates, two capacitors and one bit contact are conventional on DRAM. The areas in a DRAM to which electrical connections are made are referred to as active areas. Active areas, which serve as source and drain regions for transistors, are discrete, specially doped regions in the surface of the semiconductor substrate.

Various conventional wet etch chemistries have been used to etch silicon, such as a silicon semiconductor substrate. For example, both single crystalline and polycrystalline silicon have been wet etched using a mixture of nitric acid ("$HNO_3$") and hydrofluoric acid ("HF"). Such etchants generally provide isotropic etching. The etching is initiated by the $HNO_3$, which forms a layer of silicon dioxide on the silicon, while the HF dissolves the silicon dioxide. In some cases, water is used to dilute the etchant, with acetic acid ("$CH_3COOH$") being a preferred buffering agent, since the $CH_3COOH$ causes less disassociation of $HNO_3$ and yields a higher concentration of the disassociated species. The ratio of $HNO_3$, HF, and $CH_3COOH$ is adjusted as necessary to yield different etch rates.

In some applications, it is useful to etch silicon more rapidly along one crystalline plane compared to another crystalline plane. For example, in the diamond lattice of silicon, the (111) plane is more densely packed than the (100) plane. Thus, the etch rate of (111) silicon is expected to be lower than silicon in the (100) plane. One etchant that exhibits such orientation-dependent etching includes a solution of potassium hydroxide ("KOH") and isopropyl alcohol. This solution etches silicon about one hundred times faster along (100) planes than along (111) planes. Conventional IC processing for DRAM semiconductor devices, other memory semiconductor devices, and microprocessors, etc. is currently performed on silicon monocrystalline sliced on a (100) plane and oriented in a <110> direction. The plane and direction of the silicon are determined by a notch in the semiconductor substrate, as known in the art. However, current techniques for wet etching silicon do not always create the structures desired with the desired geometries and density with (100) silicon. Potassium hydroxide and tetramethyl ammonium hydroxide ("TMAH") are used to create vertical etches in (110) silicon by using a (110) semiconductor substrate or causing the recrystallization of the surface of a semiconductor substrate to produce a (110) crystal orientation. However, transistor properties are fastest on (100) silicon because this plane of silicon gives MOS devices the highest electron mobility. Most CMOS and DRAM devices are optimized for these types of wafers.

Recently, new techniques for forming a single crystalline silicon layer on an insulation layer, which is referred to in the art as silicon-on-insulator ("SOI"), and of integrating unit-devices on the silicon layer have been developed. In fabricating a semiconductor device using a SOI structure, a junction capacitance in driving the semiconductor device is lowered, thus improving the speed compared to a general bulk device. SOI structures may be used to provide semiconductor devices having a smaller junction area, simple isolation structure, and steeper subthreshold-voltage slopes. In a SOI structure, a silicon substrate and a silicon upper layer part are separated by a field oxide film within an SOI layer and by an insulation layer, such as a buried oxide ("BOX") layer separating the silicon upper layer part from the silicon substrate. Additionally, there is an active area sealed by the BOX layer and the field oxide film is used as a channel area of a transistor. However, the BOX layer prevents potential lines spreading into the silicon substrate, and also is a poor conductor of heat, which results in SOI power devices having greater self-heating and poorer breakdown characteristics when compared to junction isolated counterparts.

To reduce these problems, pseudo silicon-on-insulator ("PSOI") structures have been developed. PSOI structures are reported to improve DRAM leakage current by as much as 30%, which characteristic is highly desirable for DRAM manufacturing and semiconductor device performance. Some PSOI structures employ a semiconductor substrate having windows etched into the BOX layer, the windows then being refilled with silicon. The windows and silicon fill enable heat generated by the semiconductor device to dissipate more rapidly into the semiconductor substrate and also enable potential lines to spread into the semiconductor substrate, improving the breakdown voltage of the power devices. However, fabricating these PSOI structures provides some technological challenges and is expensive.

It would be desirable to provide an inexpensive method of fabricating PSOI structures for use in semiconductor memory devices, as well as in other, semiconductor non-memory devices.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

Figure 1:
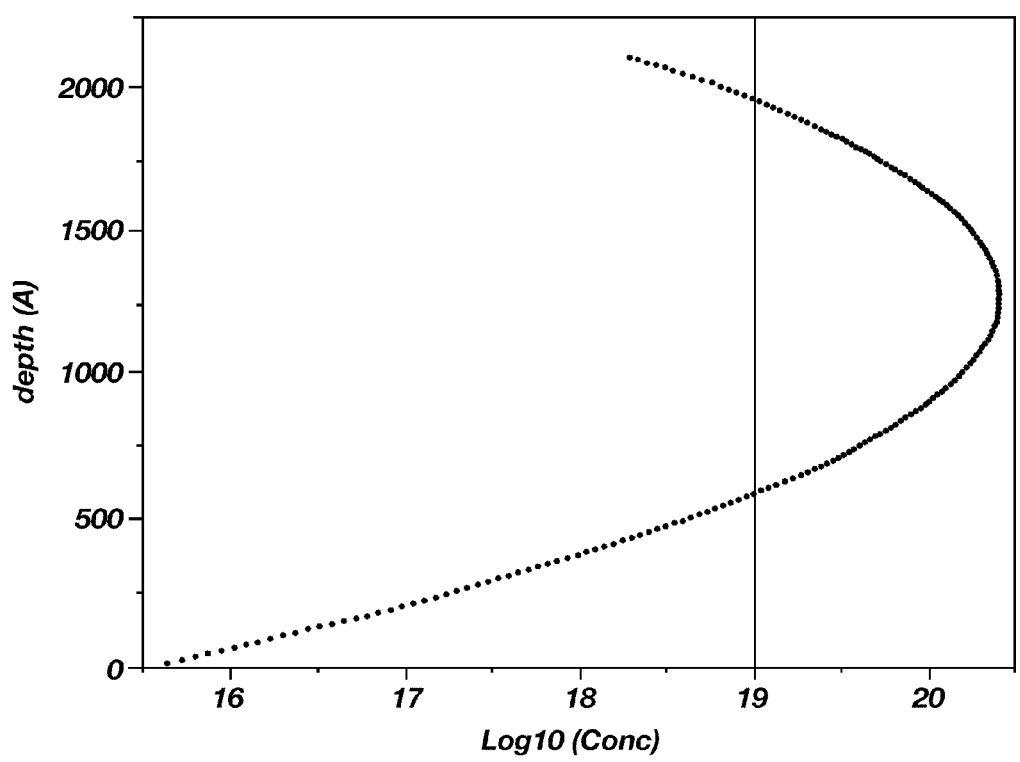
FIG. 1 depicts doping versus depth of arsenic for an accelerating voltage of 200 kV and a dose of 2 e15 As atoms/cm$^2$. The predicted range is 1270 Å with a standard deviation (sigma) of 380 Å.

The present invention relates to methods of forming at least one undercut structure in a semiconductor substrate. The method comprises providing a semiconductor substrate of semiconductor material, forming at least one n-doped (or stressed or damaged) region in the semiconductor substrate, and removing the at least one n-doped (or stressed or damaged) region to form at least one undercut structure. The at least one undercut structure may include at least one substantially vertical shelf, at least one substantially horizontal shelf, and, optionally, at least one faceted surface. The semiconductor substrate may be a monocrystalline silicon semiconductor substrate, a silicon semiconductor substrate doped with a p-type impurity, or a semiconductor substrate formed from (100) silicon.

The at least one n-doped (or stressed or damaged) region may be formed by implanting an impurity in the semiconductor substrate. To create an n-doped region, an n-type impurity may be selected from the group consisting of nitrogen, phosphorus, arsenic, antimony, bismuth and combinations thereof. The electrically neutral, but chemically active elements which may be used include carbon and germanium. Elements which may create a stressed or damaged region (causing higher etch rates) include silicon, argon, xenon, helium and combinations thereof. The at least one n-doped (or stressed or damaged) region may, optionally, be annealed. The at least one n-doped (or stressed or damaged) region may be removed by wet etching such as, for example, by using a solution of 1 part by volume hydrogen fluoride (49%), 3 parts by volume nitric acid (30%), and 8 parts by volume acetic acid (100%), or by dry etching. The etch technique employed may be selected depending upon the dopant selected. The at least one n-doped (or stressed or damaged) region may be etched without substantially etching undoped regions of the semiconductor substrate. A spin-on dielectric material may be deposited in the at least one undercut structure.

The present invention also relates to an intermediate semiconductor structure that comprises a single crystalline silicon substrate and at least one undercut structure formed in the single crystalline silicon substrate. The at least one undercut structure comprises at least one substantially vertical shelf and at least one substantially horizontal shelf. The at least one undercut structure further comprises at least one faceted surface.

A method of selectively etching doped silicon to create undercut or shelf-type structures in a semiconductor substrate is disclosed. An etchant may be used to remove more heavily doped (amorphous) silicon from the semiconductor substrate while undoped (crystalline) silicon or lightly doped silicon (as that term is defined below) remains unetched. The semiconductor substrate having the undercut structures may be used to form an intermediate semiconductor structure, such as a PSOI structure. The PSOI structure may be suitable for, but is not limited to, fabrication of DRAM, static random access memory ("SRAM"), flash memory, a CMOS imager or other electro-optical components, phase change random access memory ("PCRAM"), magnetic random access memory ("MRAM"), content addressable memory ("CAM"), complementary metal oxide semiconductor ("CMOS"), fin field effect transistor ("FinFET"), or surround gate transistor, as well as a microelectromechanical system ("MEMS"). The semiconductor substrate having the undercut structure may also be used to fabricate other non-memory devices such as, by way of example and not limitation, a performance logic circuit.

The semiconductor substrate may be implanted with an n-type impurity to form regions of heavily doped silicon, which are referred to herein as "n-doped regions." The semiconductor substrate may also be implanted with an impurity to form regions of heavily doped silicon, which are referred to herein as "stressed regions" or "damaged regions." It will be understood that regions referred to as "n-doped regions" herein may be "stressed regions" or "damaged regions" depending on the type of impurity selected for implantation. The regions of heavily doped silicon have a dopant density of greater than approximately $1 \times 10^{19}$ atoms/cm$^3$. The n-doped regions may be formed below and adjacent to regions of the semiconductor substrate that will ultimately become active areas. In other words, the n-doped regions may be formed to overlap with ends of the active areas of the semiconductor substrate. The n-doped regions may be selectively etched relative to other regions of the semiconductor substrate, such as those lacking the n-type impurity. The n-doped regions may be removed from the semiconductor substrate by the etchant while undoped regions of the semiconductor substrate remain unetched. As used herein, the phrase "undoped region" refers to a portion of the semiconductor substrate having a dopant dose of less than or equal to approximately $1 \times 10^{19}$ atoms/cm$^3$. As described in more detail below, this phrase includes undoped and lightly doped regions of the semiconductor substrate. In contrast, the phrase "n-doped region," "stressed region" or "damaged region" refer to a portion of the semiconductor substrate having a dopant density of greater than approximately $1 \times 10^{19}$ atoms/cm$^3$. Depending on the impurity that is implanted, the n-doped regions may be wet etched or dry etched to form the undercut structures in the semiconductor substrate.

Ion implantation is a desirable method in semiconductor manufacturing because of the ability to accurately control the number of implanted dopants and the ability to control the depth of deposition. The threshold dose for accelerated etching may be set at a desired depth to create a shelf of silicon for a PSOI. "Threshold dose" refers to the doping concentration that will onset accelerated etching. A dopant dosage below the threshold dose will not remove significant material while a dopant dosage above the threshold dose will remove doped material at a rate up to about 100 times faster than surrounding non-doped material. As shown in FIG. 1, the dopant is expected to be quasi-Gaussian versus depth although heavy atoms and high doses may cause pile-up. For n-type dopants, silicon doped at greater than $10^{19}$ is expected to etch much faster (i.e., up to 100 times faster) than undoped regions. By using known values for peak depth and standard deviation, the voltage may be set such that the peak is approximately two standard deviations below the desired shelf thickness. The dose may be set so that the threshold for accelerated silicon etching is at the same depth. Thus, 95% of the dopant may lie in 4 sigma (standard deviation) thick region centered on 2 sigma below the desired shelf (ledge). For a dose of $2 \times 10^{15}$ As, the peak concentration may be approximately $2.6 \times 10^{20}$/cm$^3$.

For each species and selectivity threshold, there will be a different dose and accelerating voltage as shown in Table 1. As a non-limiting example, if the desired depth is 600 Å, to a 2 sigma distribution, the following known energy values may be used:

TABLE 1

| Species | Energy {keV} |
| --- | --- |
| Xenon | 250 |
| Arsenic | 200 |
| Germanium | 170 |
| Argon | 140 |
| Phosphorus | 140 |
| Silicon | 120 |
| Hydrogen | 15 |

The larger the atom, the higher voltage needed for a given depth, but the sigma decreases depending on the n-type impurity that is implanted, the n-doped regions may be wet etched or dry etched to form the undercut structures in the semiconductor substrate. The semiconductor substrate may be a semiconductor wafer or other substrate that includes a layer of semiconductor material. As used herein, the phrase "semiconductor substrate" refers to silicon wafers, SOI substrates, silicon on sapphire ("SOS") substrates, epitaxial layers of silicon on a base semiconductor foundation, and other semiconductive materials, such as silicon-germanium. In one embodiment, the semiconductor substrate is single crystalline or monocrystalline silicon. The crystal silicon may have a crystal size at least as big as the device under construction. The semiconductor substrate may be, for example, an undoped silicon semiconductor substrate or may be a silicon semiconductor substrate that is lightly doped with a p-type impurity, such as boron. Such silicon semiconductor substrates are commercially available and may be implanted with the p-type impurity at a dopant dose that ranges from approximately $1 \times 10^{15}$ atoms/cm$^3$ to $1 \times 10^{16}$ atoms/cm$^3$. Heavy p-type dopants are known inhibitors to silicon etch and may be used as an etch stop as known in the art. As such, it is understood that the semiconductor substrate lacking the n-type impurity may, in actuality, be lightly doped with the p-type impurity. However, for the sake of convenience, both undoped and lightly doped regions of the semiconductor substrate are collectively referred to herein as being "undoped" since these regions include a lower concentration of dopant than the n-doped regions. If the semiconductor substrate is lightly doped with the p-type impurity, the n-doped regions may still be selectively etched and removed relative to these lightly doped regions.

Figure 2A:
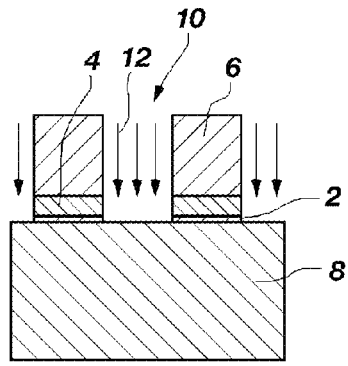
FIG. 2A is a cross-sectional view of a semiconductor substrate during fabrication of an intermediate semiconductor structure and FIG. 2B is a plan view of the same.
Figure 2B:
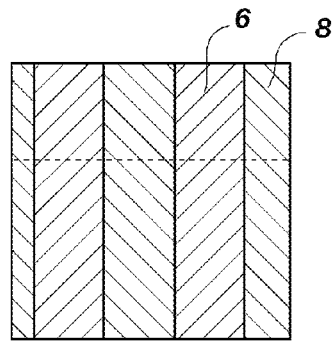

To form the intermediate semiconductor structure, such as a PSOI structure, a silicon dioxide layer 2, a silicon nitride ("SiN") layer 4, and a photoresist layer 6 may be formed over the semiconductor substrate 8, as shown in FIGS. 2A and 2B. It will be understood by one of skill in the art that a hard mask may be used instead of a photoresist layer. Exemplary hard masks are known in the art and include tungsten (W), silicon nitride (Si$_3$N$_4$), hafnium oxide (HfO$_2$) and aluminum oxide (Al$_2$O$_3$). The broken line in FIG. 2B (and subsequent drawings) is used to indicate the line along which the cross-sectional view in FIG. 2A is taken. While the fabrication of a PSOI structure is shown in FIGS. 2A-5B and 8A-9B and is described herein, the method of forming the undercut structures in the semiconductor substrate 8 may be used to fabricate other intermediate semiconductor structures. In one embodiment, the semiconductor substrate 8 is a single crystalline or monocrystalline silicon. Each of layers 2, 4 may be deposited, grown, or otherwise formed on the semiconductor substrate 8 by conventional techniques. The silicon nitride (Si$_3$N$_4$) layer 4 may protect the underlying silicon dioxide (SiO$_2$) layer 2 during subsequent processing of the semiconductor substrate 8 while the photoresist layer 6 may function as a mask during fabrication of the semiconductor substrate 8. The photoresist layer 6 may be spun on, selectively masked, exposed, and developed to form openings in the photoresist layer 6. The photoresist layer 6 may be patterned using conventional photolithography techniques, as known in the art. The openings are transferred through to the silicon dioxide layer 2 and the silicon nitride layer 4, by selective etching using the photoresist as an etch mask, forming recesses 10 and exposing a surface of the semiconductor substrate 8. Layers 2 and 4 may be patterned and etched using a wet etch or dry etch process. Such processes are known in the art, and, therefore, are not described in detail herein. The regions of the semiconductor substrate 8 protected by the remaining photoresist layer 6, as shown in FIGS. 2A and 2B, may define the location of partially isolated active areas that are ultimately to be formed in the intermediate semiconductor structure. The remaining developed portions of the photoresist layer 6 may be removed by etching, which exposes the silicon nitride layer 4 and the silicon dioxide layer 2 remaining over the semiconductor substrate 8. Alternatively, the photoresist layer 6 may be removed after implantation.

Figure 3A:
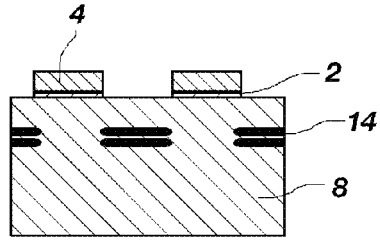
FIG. 3A is a cross-sectional view of a formation of n-doped regions during fabrication of the intermediate semiconductor structure and FIG. 3B is a plan view of the same.
Figure 3B:
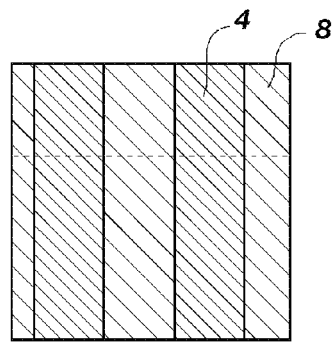

The openings 10 in the silicon nitride layer 4 and the silicon dioxide layer 2 may expose regions of the semiconductor substrate 8 that are to be implanted or otherwise doped while the portions of the silicon nitride layer 4 and the silicon dioxide layer 2 remaining on the semiconductor substrate 8 may protect the underlying regions of the semiconductor substrate 8 from becoming doped. In other words, the silicon nitride layer 4 and the silicon dioxide layer 2 may function as a mask for forming the n-doped (stressed or damaged) regions 14 in the semiconductor substrate 8, as shown in FIGS. 3A and 3B. The impurity may be implanted into the semiconductor substrate 8, forming the n-doped (stressed or damaged) regions 14. The implantation of the impurity is shown in FIG. 2A using arrows 12. The n-type impurity may be an element from Group VB of the Periodic Table of the Elements, such as nitrogen ("N"), phosphorus ("P"), arsenic ("As"), antimony ("Sb"), or bismuth ("Bi"). The impurity may also be argon ("Ar"), xenon ("Xe"), silicon ("Si"), or germanium ("Ge") which may create a stressed or damaged region. In one embodiment, the n-type impurity is As. In addition, combinations of the above-mentioned elements may be used as the dopant. Multiple implantation steps, using a combination of the above-mentioned n-type impurities as well as implantation at different angles afforded by tilting of a dopant ion beam or wafer, may be used to form a desired shape of the undercut structure. For instance, corners or the shape of faceted surfaces of the undercut structure may be tailored using multiple implantation steps.

The impurity may be disposed to penetrate a desired depth into the semiconductor substrate 8, forming the n-doped regions 14. As previously mentioned, the n-doped regions 14 are more heavily doped with the n-type impurity than other regions of the semiconductor substrate 8, and may be doped to a depth of, for example, about 2300 Å from the surface thereof. The depth and width of the n-doped regions 14 may depend on the ion type, implantation energy (acceleration voltage) and composition and crystallographic orientation of the target material (semiconductor substrate 8) relative to ion beam direction, as well as the angle of implantation (e.g., the semiconductor substrate 8 may be tilted during implantation) as known in the art. For example, implantation along a <110> crystallographic axis in silicon exposes holes in the lattice structure, resulting in channeling through the material, which phenomenon may be avoided by off-axis implantation. In addition, light ions, such as boron, backscatter from silicon, resulting in more dopant toward the surface than with a strictly Gaussian distribution, while heavy ions, such as Arsenic, result in a forward-scattered distribution relative to Gaussian. While FIG. 3A shows one complete n-doped region 14 and portions of two other n-doped regions 14, the number of n-doped regions 14 formed in the semiconductor substrate 8 is not limited thereto. Rather, the number of n-doped regions 14 may be determined by the number of undercut structures ultimately to be formed in the semiconductor substrate 8. Ion beam implantation of the n-type impurity may be performed at an energy level, for example 10-600 KeV, that achieves self-interstitial implantation. At a 600 Å deposition depth, the energy level may be between 15-250 KeV (see Table 1). The dopant implantation may cause the semiconductor substrate 8 to become amorphous in the n-doped regions 14, which provides a different etch selectivity between the n-doped regions 14 and the remainder of the semiconductor substrate 8 (the undoped regions). Implanting the semiconductor substrate 8 with the n-type impurity may be conducted by conventional techniques including, but not limited to, beamline ion implantation. This technique affords precise control of doping levels by raster scanning with the ion beam and minimizes vertical and lateral dopant spreading. However, relatively high energies must be employed, and the photoresist (if present) is undesirably heated and becomes difficult to strip, so precise process control is desirable to minimize undesirable aspects. For example, plasma may be used if the technique is modified for to minimize low surface or shallow doping. Any method which creates a low surface doping concentration (i.e., creates a deeper penetration of dopant) may be used. These techniques are known in the art and, therefore, are not described in detail herein.

As also known in the art, the n-type impurity may spread from its desired location after implantation. Stated another way, ions of the n-type impurity may spread laterally under the masked portion of the semiconductor substrate 8. Therefore, the n-doped regions 14 may, optionally, be annealed so that the n-type impurity diffuses and bonds with the material of the semiconductor substrate 8, which bonding prevents spreading. As known in the art, annealing the n-doped regions 14 may also repair damage to the semiconductor substrate 8 caused by the implantation. Annealing conditions depend on the type of impurity used and the depth of the n-doped regions 14 and may be selected by one of ordinary skill in the art. It may be desirable to anneal surface damage caused by ion implantation without annealing the lower implant center. As such, the annealing conditions are not described in detail herein, although rapid thermal annealing by laser scanning is one particularly suitable process, due to its ability to induce high localized temperatures, exhibit rapid cooling and minimize dopant diffusion. However, such systems are expensive and a halogen heat lamp system using water cooling for the back side of the semiconductor substrate 8 may be another, less expensive yet still suitable option. Annealed, n-doped regions 14 may be more easily removed from the semiconductor substrate 8 than nonannealed, n-doped regions 14 because annealing further increases the degree of etch selectivity between the n-doped regions 14 and the undoped regions of the semiconductor substrate 8. However, adequate sufficient etch selectivity is present between nonannealed, n-doped regions 14 and the undoped regions such that annealing of the n-doped regions 14 is not a strict requirement for practice of the present invention.

Figure 4A:
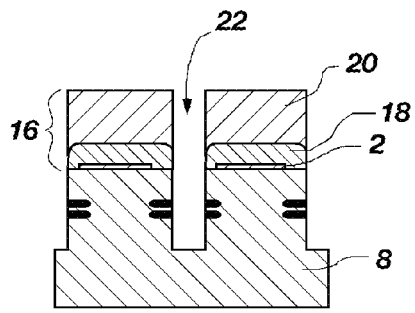
FIG. 4A is a cross-sectional view of etching the semiconductor substrate during fabrication of the intermediate semiconductor structure and FIG. 4B is a plan view of the same.
Figure 4B:
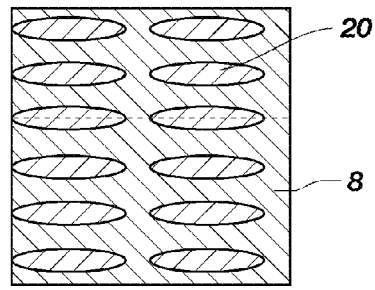

After forming the n-doped regions 14, the intermediate structure may be cleaned and a shallow trench isolation ("STI") stack 16 formed that overlaps the n-doped regions 14 and the undoped regions of the semiconductor substrate 8, as shown in FIGS. 4A and 4B. The STI stack 16 may include a second silicon nitride layer 18 is deposited on the first silicon nitride layer 4 and selectively etched using a second patterned photoresist layer 20. The pattern is also etched into the underlying semiconductor substrate 8, forming vertical trenches 22 through the semiconductor substrate 8 to a depth that extends below the n-doped regions 14. In an embodiment, the silicon nitride layer 4 may be approximately 500 Å, while the silicon dioxide layer 2 is approximately 100 Å. An etch may be performed between approximately 1800 Å to 3800 Å into the substrate 8. For a $2\times10^{15}$ dose of As at 200 keV, it is expected to have the $e^{19}$/cm threshold below approximately 550 Å and above 1800 Å deep with the peak concentration approximately 1270 Å deep. The vertical trenches 22 may be etched by conventional etching techniques. See e.g., U.S. Pat. No. 5,536,675. For example, a dry, reactive ion etch (RIE) may be employed. The vertical trenches 22 may be approximately one feature size ("F") in width. After forming the vertical trenches 22, the second patterned photoresist layer 20 may be removed.

Figure 5A:
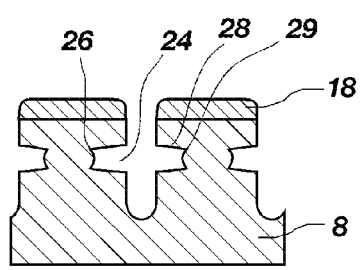
FIG. 5A is a cross-sectional view of a formation of undercut structures during fabrication of the intermediate semiconductor structure and FIG. 5B is a plan view of the same.
Figure 5B:
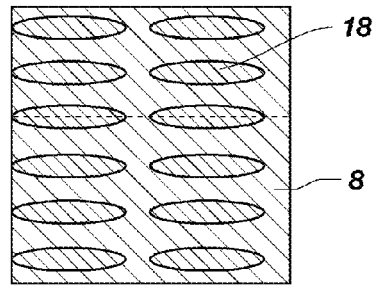

The n-doped regions 14 may then be etched using a wet etch or a dry etch process. The etch process may selectively remove the n-doped regions 14 relative to the undoped regions of the semiconductor substrate 8, forming the undercut structures 24 shown in FIGS. 5A and 5B. While FIG. 5A shows one complete undercut structure 24 and portions of two other undercut structures 24, the number of undercut structures 24 formed in the semiconductor substrate 8 is not limited thereto and may be increased or decreased as desired. Each side of the vertical trenches 22 may be undercut at the level of the n-doped regions 14 by an amount greater than or equal to approximately one feature size (1F). As such, the undercut structures 24 may be approximately 3 feature sizes (3F) in width. Contours of the undercut structures 24 may be defined by at least one vertical shelf 26, at least one horizontal shelf 28, and, optionally, at least one faceted surface. The vertical shelf 26 is formed by a substantially vertical portion of the semiconductor substrate 8 remaining after etching the n-doped regions 14. The horizontal shelf 28 is formed by a substantially horizontal portion of the semiconductor substrate 8 remaining after etching the n-doped regions 14 and may have a width of approximately 600 Å. As such, the width of the undercut structure 24 may be approximately 1800 Å. Shapes, angles, and sizes of the faceted surface, if present, may be altered with the etch conditions used and the crystallographic orientation of the semiconductor substrate 8. For instance, the faceted surface may include at least one substantially diagonal surface that is disposed, such as at 29, between and connects the vertical shelf 26 and the horizontal shelf 28. While FIG. 5A shows that the vertical shelf 26 and the horizontal shelf 28 of undercut structures 24 meet to form a corner, the vertical shelf 26 and the horizontal shelf 28 may also be connected by the faceted surface.

The etchant used to create the undercut structures 24 may be highly selective for the n-doped regions 14 relative to the undoped regions of the semiconductor substrate 8. As such, the doped crystalline silicon of the n-doped regions 14 may be removed from the semiconductor substrate 8 while the undoped crystalline silicon remains. The etchant may isotropically etch the n-doped regions 14 forming the undercut structures 24. It will be understood by those in the art that to form undercut structures 24 having the desired shape, this isotropic etch may be used in combination with an anisotropic etch. The undercut structures 24 may form a cavity in the semiconductor substrate 8 below and adjacent to locations where the active area is ultimately to be formed. As a result of forming the undercut structures 24, the active areas may be at least partially isolated from the undoped regions, or remainder, of the semiconductor substrate 8.

The etchant used to remove the n-doped regions 14 may be a hydroxide-based, wet etchant. Hydroxide-based etchants are known in the art for use in MEMS technology. However, such hydroxide-based etchants have typically been used to etch features on the order of μm in size, not nm in size as described herein. For the sake of example only, the etchant may be a solution of HF, $HNO_3$, and $CH_3COOH$. The $HNO_3$ in the solution may oxidize the silicon in the n-doped regions 14 of the semiconductor substrate 8 to form silicon oxide, which is dissolved by the HF. In one embodiment, the solution may include 1 part 49% by volume HF, 3 parts 30% by volume $HNO_3$, and 8 parts 100% by volume $CH_3COOH$ (1 HF:3 $HNO_3$:8 $CH_3COOH$). This etchant is known in the art as a "1-3-8" etch and etches doped silicon approximately 100 times faster than undoped silicon. For instance, a solution of the 1-3-8 etchant may etch silicon having a P concentration greater than approximately $8\times10^{18}$ atoms/$cm^3$ at a rate of approximately 2 μm/min. At a P concentration of approximately $5\times10^{17}$ atoms/$cm^3$, the etch rate may be approximately 0.16 μm/min. However, the ratio of the HF, $HNO_3$ and $CH_3COOH$ may be adjusted to achieve the desired etching of the n-doped regions 14.

The etchant may also be dilute HF and 4 $HNO_3$. Another exemplary etchant is a buffered fluoride etch solution that includes a fluoride component, an inorganic acid component, and an oxidizing agent, as disclosed in U.S. Pat. No. 6,391,793 to Lee et al., the disclosure of which is incorporated by reference herein in its entirety. The fluoride component may include, but is not limited to, HF, $HF2^-$, ammonium fluoride ("$NH_4F$"), tetramethylammonium fluoride ("TMAF"), or mixtures thereof. The inorganic acid component may include, but is not limited to, HF, phosphoric acid ("$H_3PO_4$"), sulfuric acid ("$H_2SO_4$"), $HNO_3$, hydrochloric acid ("HCl"), carbonic acid ("$H_2CO_3$"), any other suitable inorganic acid, or mixtures thereof. In one embodiment, the inorganic acid component is $H_3PO_4$ or $H_2CO_3$. The oxidizing agent may include, but is not limited to, hydrogen peroxide ("$H_2O_2$"), ozone ("$O_3$"), or mixtures thereof. In one embodiment, the oxidizing agent is $H_2O_2$. Tetramethyl Ammonium Hydroxide ("TMAH") may also be employed. Additional wet etchants that are selective for the n-doped regions 14 relative to the undoped regions may also be used.

To further increase the selectivity of the etchant for the n-doped regions 14, the semiconductor substrate 8 may be exposed to light or a voltage. For example, 0.4-0.6 V may be applied to the semiconductor substrate 8 relative to the etchant and etch the doped region selective to the semiconductor substrate 8. Local potential may be created at a p/n junction as known in the art. The light or voltage may provide increased selectivity for the n-doped regions 14 at a lower level of doping.

In addition to wet etches, a dry etch process may be used to remove the n-doped regions 14. The dry etchant may be a chlorine-based etchant or another halogen-based etchant such as bromine or fluorine.

Figure 6:
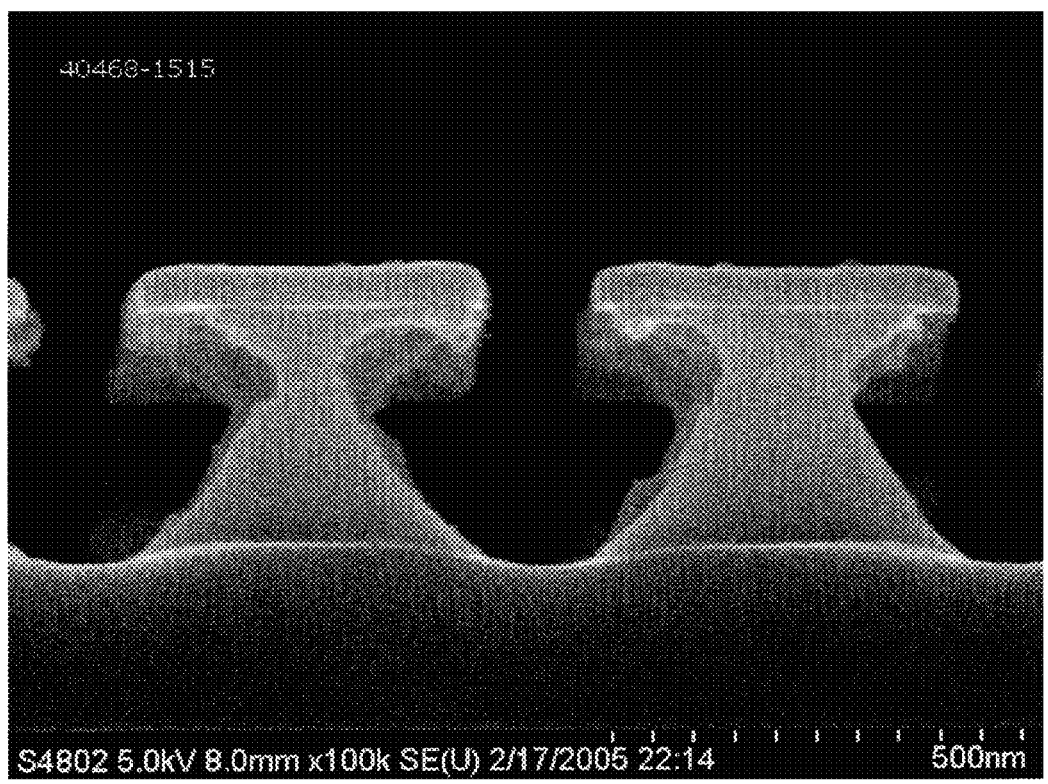
FIG. 6 is a scanning electron micrograph ("SEM") showing an embodiment of undercut structures formed according to the present invention.
Figure 7:
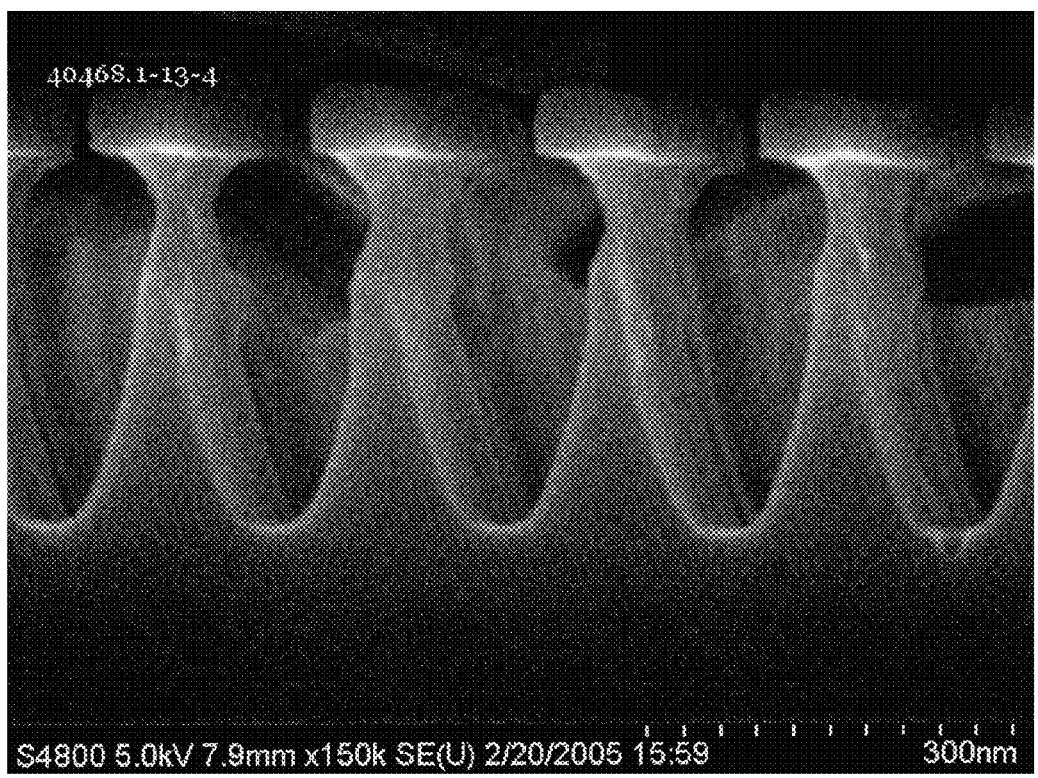
FIG. 7 is a SEM showing another embodiment of undercut structures formed according to the present invention.

SEMs of undercut structures 24 are shown in FIGS. 6 and 7. In FIG. 6, a (100) silicon substrate was doped with As at $2\times10^{15}$ atoms/$cm^3$ at 200 keV, forming the n-doped regions 14 (not shown in FIG. 6). To vertically etch the (100) silicon substrate, a conventional dry etch process was first used. An exemplary etch process is described in U.S. Pat. No. 5,536,675 which is incorporated herein by reference. The (100) silicon substrate was then wet etched for 25 seconds using a solution of a hydroxide-based etchant (comprising 10 L $NH_4F$+5 L QEII+7.5 L $H_2O_2$ in a ratio of 4:2:3), forming the undercut structures 24. QEII is available from Olin Microelectronics Materials (Norwalk, Conn.) and includes deionized water: $NH_4F$:$H_3PO_4$ (60:39:1). In FIG. 7, a (100) silicon substrate was doped with As at $1\times10^{14}$ atoms/$cm^3$ at 200 keV, forming the n-doped regions 14 (not shown in FIG. 7). To vertically etch the (100) silicon substrate, the (100) silicon substrate was first conventionally dry etched. The (100) silicon substrate was then wet etched with a 5:3 solution of $NH_4OH$:$NH_4F$ for seven minutes, forming the undercut structures 24. The undercut structures 24 may be approximately 5 feature sizes (5F) in width.

Figure 8A:
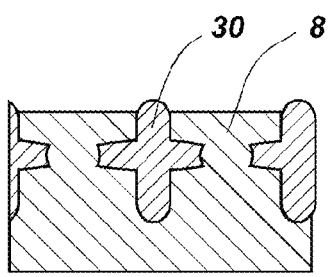
FIG. 8A is a cross-sectional view of filling the undercut structures during fabrication of the intermediate semiconductor structure and FIG. 8B is a plan view of the same.
Figure 8B:
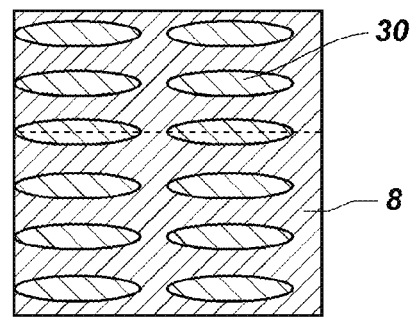

The undercut structures 24 may be lined with an oxide layer (not shown), such as a thermal oxide or a grown oxide. The lined, undercut structures 24 may then be filled with a spin-on dielectric ("SOD") material 30, as shown in FIGS. 8A and 8B. The second, patterned silicon nitride layer 18 as well as SOD material above the level of semiconductor substrate may be removed, for example, by an abrasive technique such as chemical mechanical planarization ("CMP").

Figure 9A:
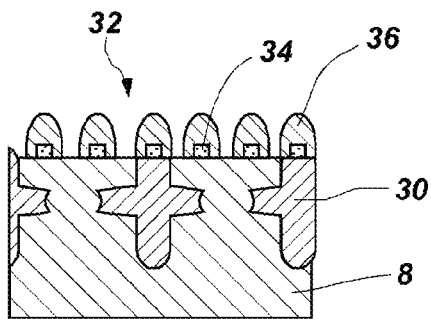
FIG. 9A is a cross-sectional view of the intermediate semiconductor structure fabricated according to the method of the present invention and FIG. 9B is a plan view of the same.
Figure 9B:
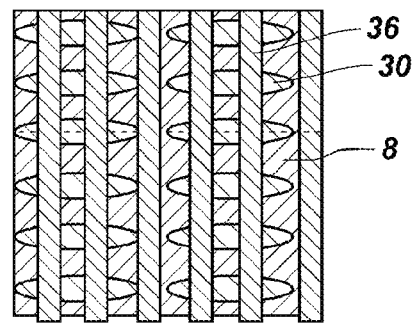

To complete the intermediate semiconductor structure 32, additional processing may be conducted to form, for example, digit line junctions, storage node junctions, transistors, capacitors, or digit lines in or on the semiconductor substrate 8, such as in or on the active areas. For instance, gate stacks 34 may be formed on the surface of the semiconductor substrate 8, as shown in FIGS. 9A and 9B. The gate stacks 34 may be formed by conventional techniques, which are not described herein for the sake of brevity. Some of the gate stacks 34 may overlie the undercut structures 24 while other gate stacks 34 are located between the undercut structures 24. Those of skill in the art will understand that the gate stacks 34 may overlie a bulk substrate rather than overlying undercut structures 24 or being located between the undercut structures 24. A third $Si_3N_4$ layer 36 may then be formed over the gates stacks 34, forming a portion of a transistor.

The undercut structures 24 may partially isolate the active areas that are ultimately formed in the intermediate semiconductor structure 32 from other portions of the semiconductor substrate 8. As previously discussed, the intermediate semiconductor structure 32 may be a PSOI structure, such as a DRAM, SRAM, flash, imager, PCRAM, MRAM, CAM, CMOS imager or other electro-optical component, finFET, surround gate transistor, MEMS, or a performance logic circuit. The resulting intermediate semiconductor structure 32 may have low leakage, which enables shorter capacitors to be formed on the semiconductor substrate 8. As such, the yield of capacitors on the semiconductor substrate 8 may be increased. The smaller, required capacitance may also improve the time to charge and discharge the capacitors.

Forming the undercut structures 24 in the semiconductor substrate 8, as described above, may have a reduced number of steps compared to conventional methods of forming PSOI structures. For instance, the number of etches (wet or dry) used to fabricate the PSOI structure may be reduced, reducing the cost of the fabrication process and the potential for defects in subsequent downstream processing. In addition, in contrast to conventional methods of fabricating PSOI structures, spacers are not needed to form the intermediate semiconductor structure 32. As such, forming the undercut structures 24 as described above may be a more elegant and cost effective method than conventional methods of forming PSOI structures.

While FIGS. 2A-5B and 8A-9B illustrate the fabrication of a $6F^2$ DRAM, where F is the minimum feature size, additional DRAM structures may also be formed, such as $8F^2$ DRAM. However, the $6F^2$ DRAM architecture enables memory cell size to be reduced and DRAM density to be increased, which increases the potential die-per-wafer yield by approximately 20 percent at a given process technology node. While the intermediate semiconductor structure 32 depicted in FIGS. 9A and 9B illustrates one type of intermediate semiconductor structure that may be fabricated upon the semiconductor substrate 8 having the undercut structures 24, those of ordinary skill in the art will recognize the advantages of fabricating other types of structures according to various embodiments and their equivalents. For instance, the intermediate semiconductor structure 32 may be any active semiconductor device where the active area is at least partially isolated from the bulk of the semiconductor substrate 8.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A semiconductor structure, comprising:
a single crystalline silicon substrate; and
at least one undercut structure located entirely within the single crystalline silicon substrate, the at least one undercut structure comprising:
a vertical trench extending into the single crystalline silicon substrate; and
a horizontal trench below an upper surface of the single crystalline silicon substrate and intersecting the vertical trench, the horizontal trench comprising at least one substantially vertical shelf within the single crystalline silicon substrate and at least one substantially horizontal shelf within the single crystalline silicon substrate such that portions of the single crystalline silicon substrate are above the at least one substantially horizontal shelf.

2. The semiconductor structure of claim 1, wherein the at least one undercut structure further comprises at least one faceted surface.

3. The semiconductor structure of claim 1, further comprising silicon dioxide material over the single crystalline silicon substrate.

4. The semiconductor structure of claim 1, further comprising silicon nitride material over the single crystalline silicon substrate.

5. The semiconductor structure of claim 1, wherein the single crystalline silicon substrate is lightly doped with a p-type impurity.

6. The semiconductor structure of claim 1, wherein the vertical trench which extends between approximately 1800 Å and 3800 Å below the upper surface of the single crystalline silicon substrate.

7. The semiconductor structure of claim 1, wherein the at least one undercut structure has a width of approximately three feature sizes.

8. A semiconductor structure comprising:
a vertical opening within a (100) silicon substrate; and
a substantially horizontal opening below an upper surface of the (100) silicon substrate and intersecting a portion of the vertical opening, the substantially horizontal opening extending away from the vertical opening and comprising substantially horizontal shelves such that portions of the (100) silicon substrate are above the substantially horizontal shelves and substantially vertical shelves connected by faceted surfaces, the vertical opening extending into the (100) silicon substrate below the substantially horizontal opening.

9. The semiconductor structure of claim 8, wherein the faceted surfaces abut a doped region of the (100) silicon substrate.

10. The semiconductor structure of claim 8, further comprising an oxide material lining the substantially horizontal opening.

11. The semiconductor structure of claim 8, further comprising dielectric material within the substantially horizontal opening.

12. The semiconductor structure of claim 11, wherein the dielectric material fills the substantially horizontal opening.

13. The semiconductor structure of claim 8, further comprising a gate stack overlying the substantially horizontal opening.

14. The semiconductor structure of claim 8, wherein the substantially horizontal opening and the vertical opening at least partially isolate active areas of the (100) silicon substrate.

15. A semiconductor structure comprising a semiconductor substrate having an undercut feature abutting an opening of a vertical trench, the undercut feature formed entirely below an upper surface of the semiconductor substrate and including a lateral cavity including faceted surfaces such that portions of the semiconductor substrate are above the lateral cavity, the vertical trench extending within the semiconductor substrate below the undercut feature.

16. The semiconductor structure of claim 15, wherein the undercut feature further includes at least one angled sidewall.

17. The semiconductor structure of claim 15, wherein the undercut feature has a width of approximately five features (5F).

18. The semiconductor structure of claim 15, wherein the semiconductor substrate is lightly doped with a p-type impurity at a dopant dose from approximately $1\times10^{15}$ atoms/cm$^3$ to $1\times10^{16}$ atoms/cm$^3$.

19. The semiconductor structure of claim 15, wherein the semiconductor substrate is (100) silicon.

20. The semiconductor structure of claim 15, further comprising an oxide material filling the undercut feature.

21. The semiconductor structure of claim 15, further comprising n-type dopants in the semiconductor substrate adjacent the undercut feature.

\* \* \* \* \*

UNITED STATES PATENT AND TRADEMARK OFFICE
CERTIFICATE OF CORRECTION

| | | |
|---|---|---|
| PATENT NO. | : 8,664,742 B2 | Page 1 of 1 |
| APPLICATION NO. | : 12/622939 | |
| DATED | : March 4, 2014 | |
| INVENTOR(S) | : David H. Wells et al. | |

It is certified that error appears in the above-identified patent and that said Letters Patent is hereby corrected as shown below:

On the title page, in item (56), under "Other Publications", in column 2, line 2, delete "Anisoptropic" and insert -- Anisotropic --, therefor.

In the Claims

In column 12, line 26, in Claim 6, after "trench" delete "which".

Signed and Sealed this

Fourth Day of November, 2014

Michelle K. Lee
*Deputy Director of the United States Patent and Trademark Office*